(12) United States Patent
Hirose et al.

(10) Patent No.: US 11,264,302 B2
(45) Date of Patent: Mar. 1, 2022

(54) HEAT DISSIPATION SHEET, MANUFACTURING METHOD OF HEAT DISSIPATION SHEET, AND ELECTRONIC APPARATUS

(71) Applicant: FUJITSU LIMITED, Kawasaki (JP)

(72) Inventors: Shinichi Hirose, Yokohama (JP); Daiyu Kondo, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 22 days.

(21) Appl. No.: 16/105,029

(22) Filed: Aug. 20, 2018

(65) Prior Publication Data

US 2019/0057926 A1 Feb. 21, 2019

(30) Foreign Application Priority Data

Aug. 21, 2017 (JP) .............................. JP2017-158619

(51) Int. Cl.
| | | |
|---|---|---|
| *H01L 23/00* | (2006.01) | |
| *H01L 23/373* | (2006.01) | |
| *H01L 21/48* | (2006.01) | |
| *H01L 23/367* | (2006.01) | |
| *B32B 27/08* | (2006.01) | |
| *B32B 27/20* | (2006.01) | |

(52) U.S. Cl.
CPC .......... *H01L 23/3735* (2013.01); *B32B 27/08* (2013.01); *B32B 27/20* (2013.01); *H01L 21/4803* (2013.01); *H01L 23/367* (2013.01); *H01L 23/373* (2013.01); *H01L 23/3733* (2013.01); *B32B 2260/02* (2013.01); *B32B 2260/046* (2013.01); *B32B 2264/10* (2013.01); *B32B 2307/302* (2013.01); *B32B 2457/14* (2013.01); *H01L 2224/16225* (2013.01); *H01L 2224/73253* (2013.01); *H01L 2924/16152* (2013.01); *H01L 2924/3511* (2013.01)

(58) Field of Classification Search
CPC ............. H01L 23/3735; H01L 21/4803; H01L 23/367; H01L 23/373; H01L 23/3733; B32B 27/08; B32B 27/20; B32B 2260/02; B32B 2260/046; B32B 2264/10; B32B 2307/302; B32B 2457/14
See application file for complete search history.

(56) References Cited

U.S. PATENT DOCUMENTS

2007/0099792 A1* 5/2007 Khabashesku ........... C08K 7/24
501/95.3
2010/0119436 A1* 5/2010 Takimoto ............... B01J 21/185
423/447.2

(Continued)

FOREIGN PATENT DOCUMENTS

| JP | 2005-150362 | 6/2005 |
|---|---|---|
| JP | 2006-147801 | 6/2006 |

(Continued)

*Primary Examiner* — Mounir S Amer
*Assistant Examiner* — Alexander Belousov
(74) *Attorney, Agent, or Firm* — Fujitsu Patent Center

(57) ABSTRACT

A heat dissipation sheet includes a first sheet composed of a plurality of first carbon nanotubes, and a second sheet composed of a plurality of second carbon nanotubes, wherein the first sheet and the second sheet are coupled in a stacked state, and the first carbon nanotubes and the second carbon nanotubes are different in an amount of deformation when pressure is applied.

15 Claims, 22 Drawing Sheets

(56) References Cited

U.S. PATENT DOCUMENTS

| | | | |
|---|---|---|---|
| 2012/0236502 A1* | 9/2012 | Yamaguchi | H01L 23/373 |
| | | | 361/704 |
| 2016/0086872 A1* | 3/2016 | Sakita | H01L 23/373 |
| | | | 361/704 |
| 2016/0130493 A1 | 5/2016 | Hirose et al. | |
| 2016/0200460 A1* | 7/2016 | Aston | B32B 37/16 |
| | | | 244/171.7 |

FOREIGN PATENT DOCUMENTS

| | | |
|---|---|---|
| JP | 2006-303240 | 11/2006 |
| JP | 2011-222746 | 11/2011 |
| JP | 2014-060252 | 4/2014 |
| JP | 2016-092334 | 5/2016 |

\* cited by examiner

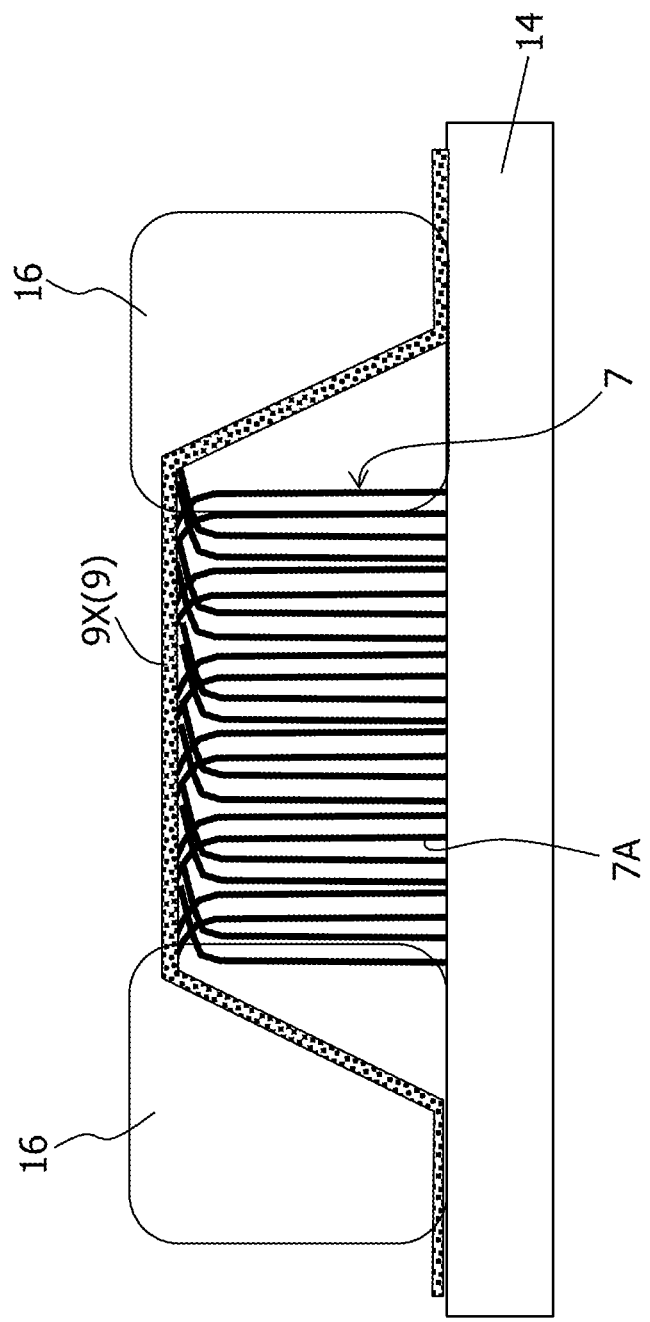

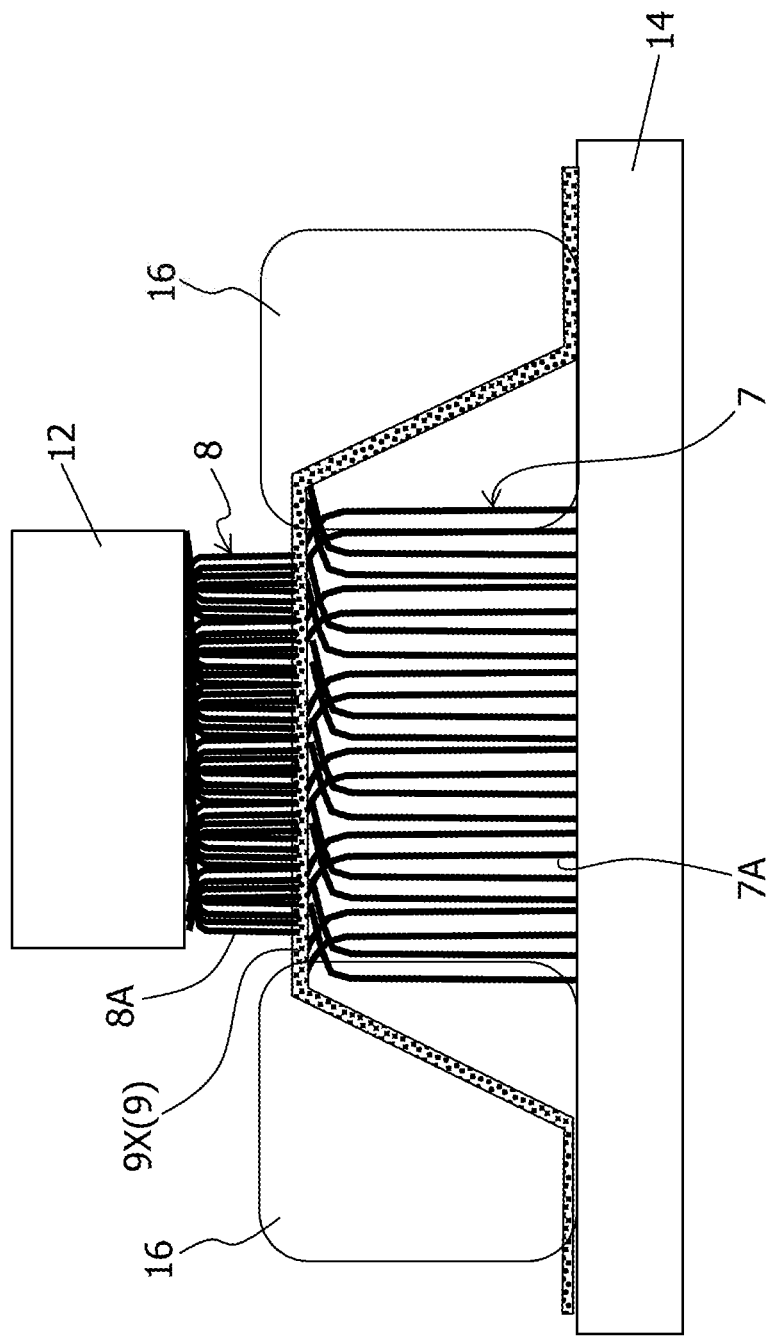

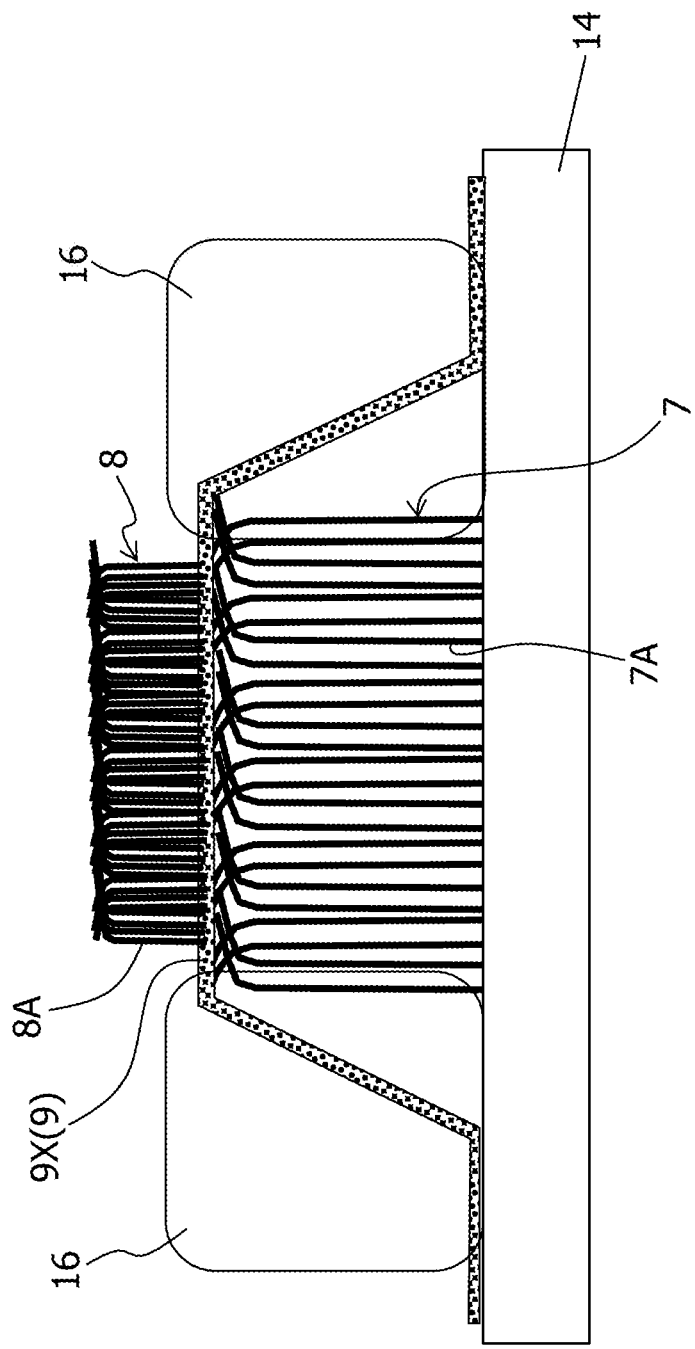

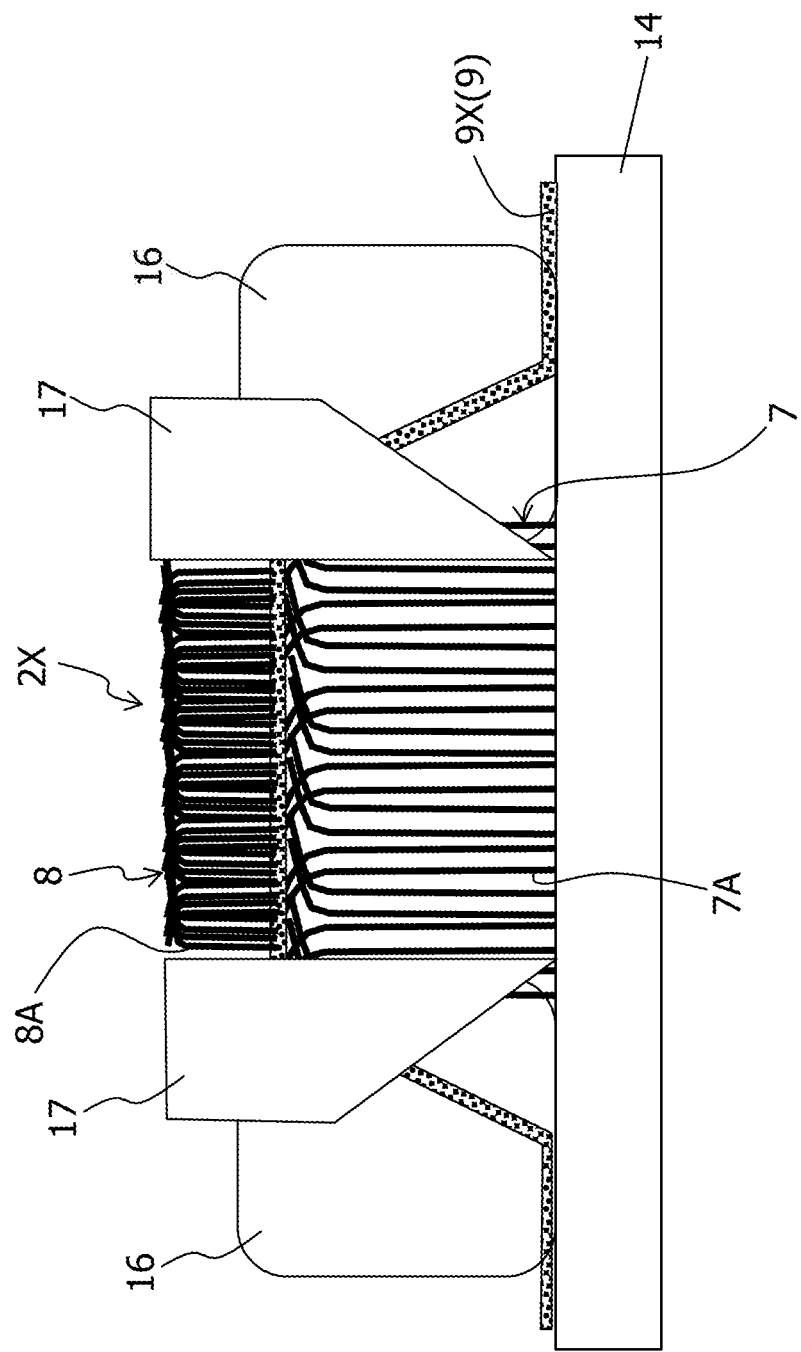

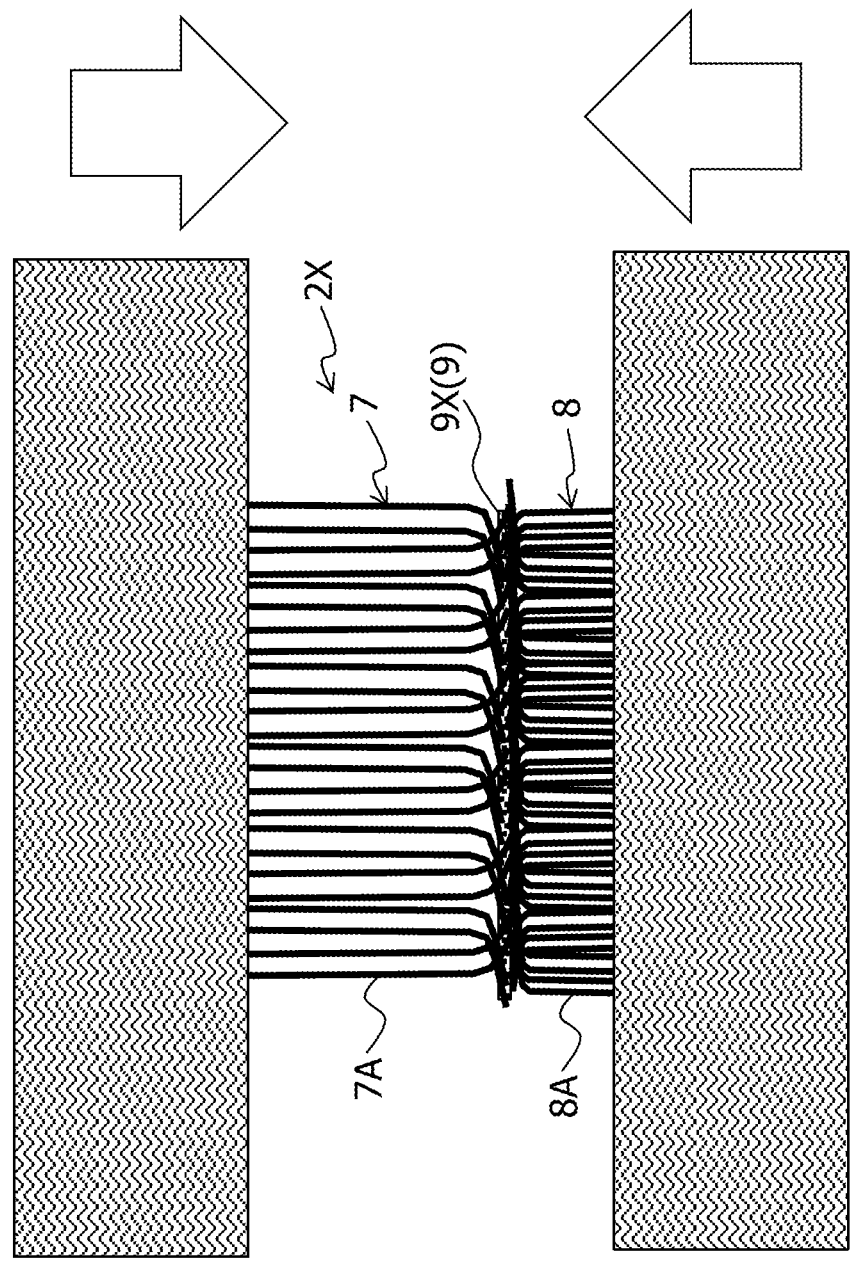

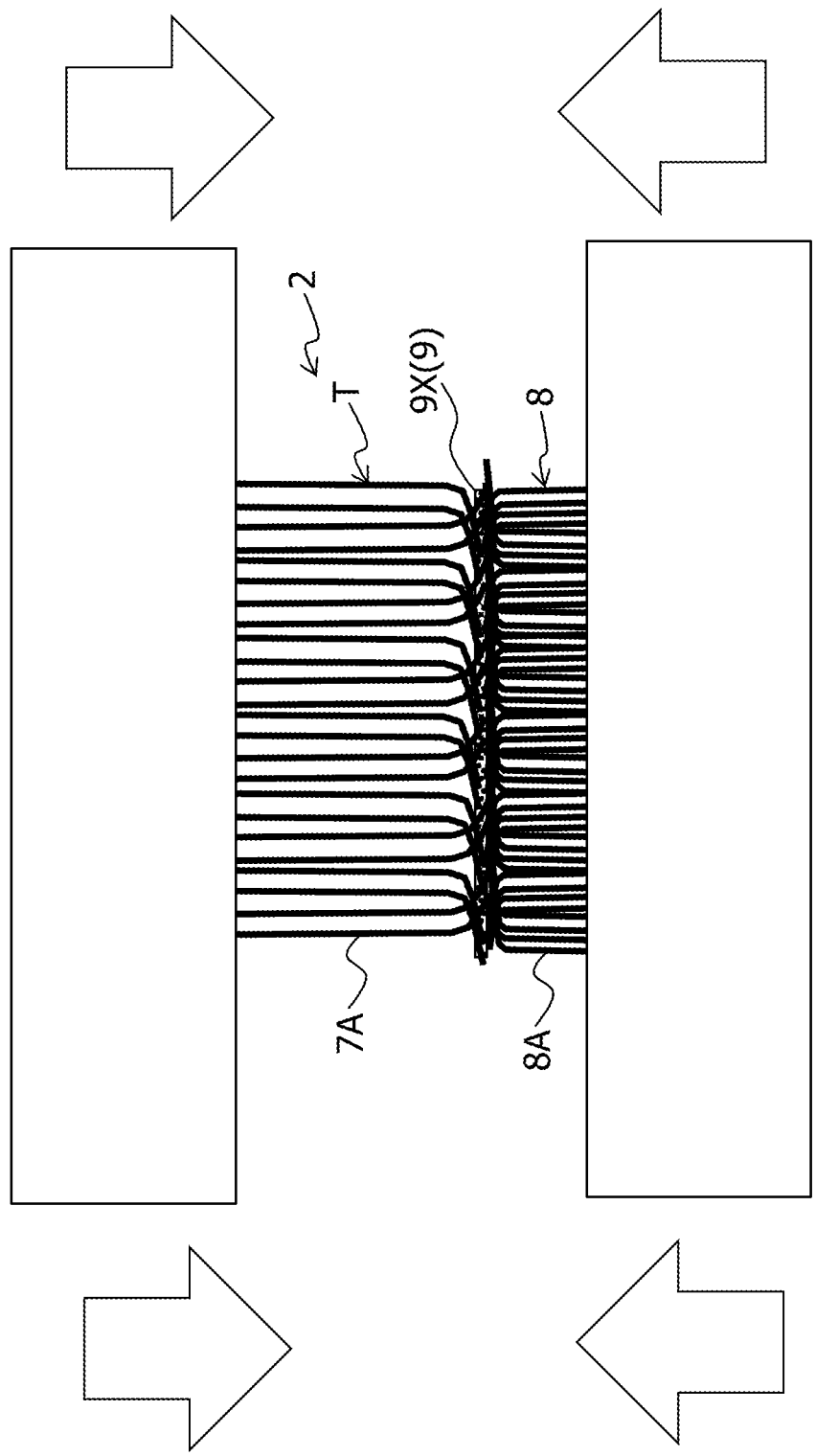

ND ELECTRONIC APPARATUS

HEAT DISSIPATION SHEET, MANUFACTURING METHOD OF HEAT DISSIPATION SHEET, AND ELECTRONIC APPARATUS

CROSS-REFERENCE TO RELATED APPLICATION

This application is based upon and claims the benefit of priority of the prior Japanese Patent Application No. 2017-158619, filed on Aug. 21, 2017, the entire contents of which are incorporated herein by reference.

FIELD

The embodiments discussed herein are related to a heat dissipation sheet, a manufacturing method of a heat dissipation sheet, and an electronic apparatus.

BACKGROUND

Electronic parts used for central processing apparatus (central processing unit (CPU)) of servers and personal computers and so forth are desired to efficiently dissipate heat generated from a semiconductor chip. The semiconductor chip is referred to also as a semiconductor element or heat generator.

Thus, the electronic parts have a structure in which a heat spreader composed of a material having high thermal conductivity, such as copper, is disposed with the intermediary of a thermally-conductive sheet or the like, such as an indium sheet, set directly on the semiconductor chip.

However, the price of indium has sharply risen due to large increase in demands for rare metals in recent years and an alternative material less expensive than indium is expected. Furthermore, also in terms of properties, it may not be said that the thermal conductivity of indium (approximately 80 W/m·K) is high, and a material having higher thermal conductivity in order to more efficiently dissipate heat generated from the semiconductor chip is desired.

From such a background, the carbon nanotube (CNT) is attracting attention as a material having higher thermal conductivity than indium. The carbon nanotube is a material having very high thermal conductivity (approximately 1500 to 3000 W/m·K) and besides, having excellence in flexibility and heat resistance and has high potential as a heat dissipation material.

As heat dissipation sheets using carbon nanotubes, there are a heat dissipation sheet in which carbon nanotubes are dispersed in resin, a heat dissipation sheet in which carbon nanotube bundles grown on a substrate in an oriented manner are buried by resin, and so forth, for example.

However, in the heat dissipation sheet using carbon nanotubes, it is desired to ensure the thickness of the sheet.

Meanwhile, warpage or deformation often occurs in the semiconductor chip or the heat spreader. In this case, it is also desired to allow the heat dissipation sheet to follow the warpage or deformation of the semiconductor chip or the heat spreader.

The followings are reference documents.
[Document 1] Japanese Laid-open Patent Publications No. 2005-150362,
[Document 2] Japanese Laid-open Patent Publications No. 2006-147801,
[Document 3] Japanese Laid-open Patent Publications No. 2006-303240,
[Document 4] Japanese Laid-open Patent Publications No. 2016-092334,
[Document 5] Japanese Laid-open Patent Publications No. 2014-060252, and
[Document 6] Japanese Laid-open Patent Publications No. 2011-222746.

SUMMARY

According to an aspect of the embodiments, a heat dissipation sheet includes a first sheet composed of a plurality of first carbon nanotubes, and a second sheet composed of a plurality of second carbon nanotubes, wherein the first sheet and the second sheet are coupled in a stacked state, and the first carbon nanotubes and the second carbon nanotubes are different in an amount of deformation when pressure is applied.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 13 is a schematic diagram for explaining a manufacturing method of a heat dissipation sheet according to the embodiment;

FIG. 14 is a schematic diagram for explaining a manufacturing method of a heat dissipation sheet according to the embodiment;

FIG. 15 is a schematic diagram for explaining a manufacturing method of a heat dissipation sheet according to the embodiment;

FIG. 16 is a schematic diagram for explaining a manufacturing method of a heat dissipation sheet according to the embodiment;

FIG. 17 is a schematic diagram for explaining a manufacturing method of a heat dissipation sheet according to the embodiment;

FIG. 18 is a schematic diagram for explaining a manufacturing method of a heat dissipation sheet according to the embodiment;

FIG. 19A is a schematic diagram illustrating a configuration when a heat dissipation sheet of the embodiment is used and FIG. 19B is a diagram illustrating relationship between compressive stress and compressive displacement when a heat dissipation sheet of the embodiment is used.

DESCRIPTION OF EMBODIMENTS

A heat dissipation sheet, a manufacturing method of a heat dissipation sheet, and an electronic apparatus according to an embodiment of the present disclosure will be described below with reference to FIG. 1 to FIG. 22.

Figure 2:
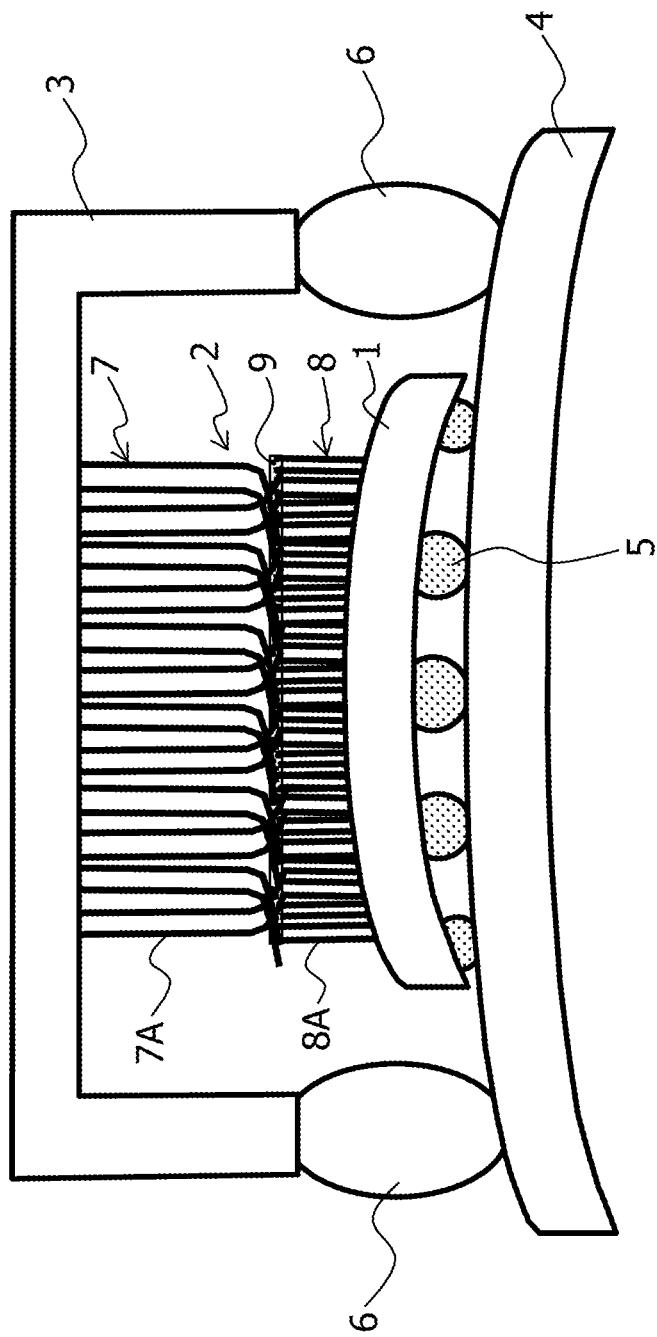
FIG. 2 is a schematic diagram illustrating a configuration of an electronic apparatus including a heat dissipation sheet according to the embodiment.

The electronic apparatus according to the present embodiment is a server, personal computer, or the like, for example, and, as illustrated in FIG. 2, includes a semiconductor chip 1 as a heat generation source, a heat dissipation sheet 2 thermally connected to the semiconductor chip 1, and a heat spreader 3 thermally connected to the heat dissipation sheet 2.

Here, the semiconductor chip 1 is mounted over a wiring board 4 with the intermediary of bumps 5. Furthermore, in FIG. 2, numeral 6 denotes a sealant.

Here, the heat dissipation sheet 2 connects the semiconductor chip 1 and the heat spreader 3 mechanically and thermally and is a heat dissipation sheet using carbon nanotubes as described later.

The heat spreader 3 functions as a heat sink in some cases and therefore the heat spreader is called the heat sink in some cases.

Figure 1:
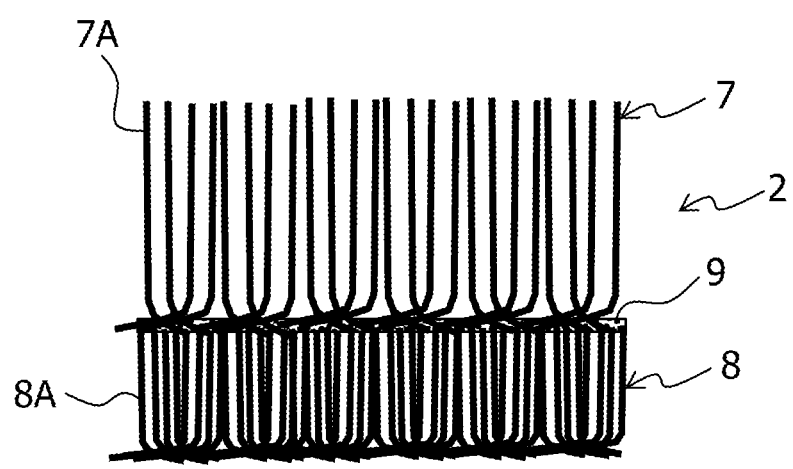
FIG. 1 is a schematic diagram illustrating a configuration of a heat dissipation sheet according to an embodiment of the present disclosure.

In the present embodiment, as illustrated in FIG. 1, the heat dissipation sheet 2 includes a first sheet 7 composed of plural first carbon nanotubes 7A and a second sheet 8 composed of plural second carbon nanotubes 8A.

Furthermore, the first sheet 7 and the second sheet 8 are coupled in a stacked state.

In the present embodiment, the first sheet 7 and the second sheet 8 are coupled by resin 9.

In this case, as described later, the first sheet 7 and the second sheet 8 may be coupled by the resin (thin film resin) 9 by using a resin film 9X (for example, see FIG. 11 to FIG. 18) or the first sheet 7 and the second sheet 8 may be coupled by the resin (thin film resin) 9 by applying a resin film to an end surface of the first sheet 7 or the second sheet 8, or the like.

The configuration is not limited thereto and the first sheet 7 and the second sheet 8 may be coupled by a metal such as copper, silver, or gold. For example, the first sheet 7 and the second sheet 8 may be coupled by a metal by individually forming a thin film of the metal such as copper, silver, or gold on an end surface of the first sheet 7 and the second sheet 8 and joining the metal thin films to each other by thermocompression bonding or the like.

In the present embodiment, the carbon nanotubes 7A and 8A are metal carbon nanotubes. Furthermore, the sheets 7 and 8 composed of the plural carbon nanotubes 7A and 8A are sheets composed of plural carbon nanotubes (for example, multilayer carbon nanotubes) oriented in a certain direction. The sheets are referred to also as sheet-shaped structures or carbon nanotube structures.

Furthermore, the first carbon nanotubes 7A and the second carbon nanotubes 8A are different in the amount of deformation when pressure is applied.

Here, in the case in which the heat dissipation sheet 2 is mounted between the semiconductor chip 1 and the heat spreader 3 included in the electronic apparatus, warpage or deformation often occurs in the semiconductor chip 1 or the heat spreader 3 and pressure is applied to the heat dissipation sheet 2 according to such warpage or deformation.

In the present embodiment, the amount of deformation when pressure is applied is larger in the second carbon nanotubes 8A than in the first carbon nanotubes 7A.

Here, in the first carbon nanotubes 7A, the amount of deformation when pressure is applied is small and the difference in the length between before and after pressure is applied is several percentages with respect to the length before the pressure is applied. As above, the first carbon nanotubes 7A (first sheet 7) do not have flexibility but have durability against pressure.

In contrast, in the second carbon nanotubes 8A, the amount of deformation when pressure is applied is large and the difference in the length between before and after pressure is applied is several tens of percentages with respect to the length before the pressure is applied. As above, the second carbon nanotubes 8A (second sheet 8) have flexibility and absorb the applied pressure.

As above, the first carbon nanotubes 7A have a small amount of deformation when pressure is applied and therefore enable ensuring of the thickness of the sheet.

In contrast, the second carbon nanotubes 8A have a large amount of deformation when pressure is applied. Thus, when warpage or deformation occurs in the semiconductor chip 1 or the heat spreader 3 (in FIG. 2, when warpage or deformation occurs in the semiconductor chip 1), the second carbon nanotubes 8A may follow the warpage or deformation.

This may suppress the occurrence of the situation in which, when warpage or deformation occurs in the semiconductor chip 1 or the heat spreader 3 (in FIG. 2, when warpage or deformation occurs in the semiconductor chip 1), the heat dissipation sheet 2 does not follow the warpage or deformation and becomes the state of being not thermally connected to the semiconductor chip 1 or the heat spreader 3 partly, and allows ensuring of sufficient heat dissipation performance.

Figure 21:
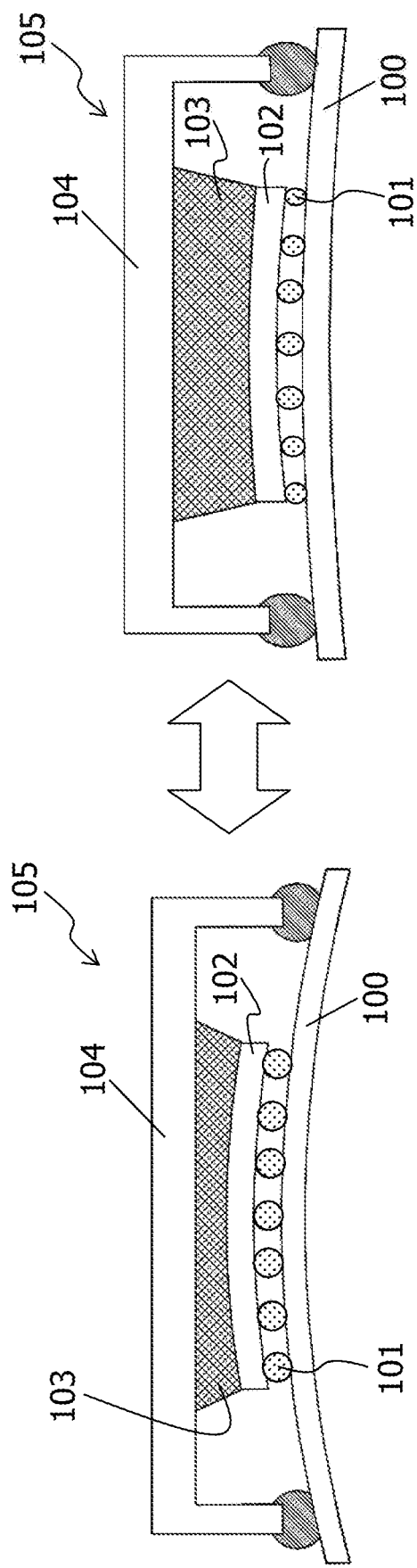
FIG. 21 is a diagram for explaining a problem to be solved by the present disclosure.

As illustrated in FIG. 21, in electronic apparatus 105 having a structure in which a heat spreader 104 is connected, through a heat dissipation material 103, to a semiconductor chip 102 mounted over a wiring board 100 with the intermediary of bumps 101, warpage or deformation occurs in the semiconductor chip 102 as a heat generation source and the semiconductor chip 102 reverts to the original state at the time of room temperature and at the time of rise in the temperature.

Figure 22:
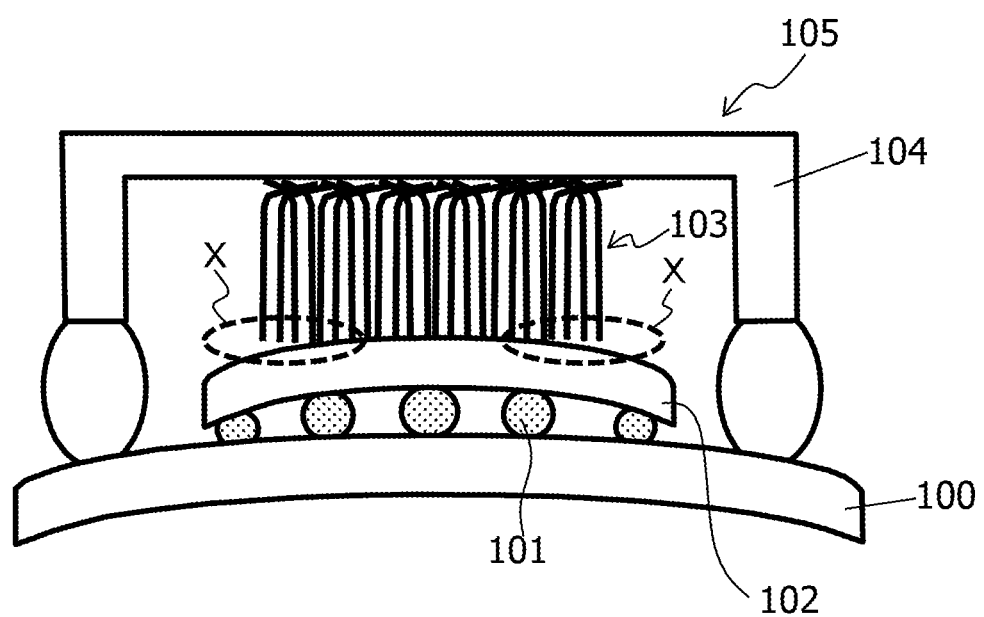
FIG. 22 is a diagram for explaining a problem to be solved by the present disclosure.

If a high-temperature treatment carbon nanotube sheet like one described later is used as the heat dissipation material 103 in such electronic apparatus 105, the following situation occurs. For example, as illustrated in FIG. 22, when warpage or deformation of the semiconductor chip 102 occurs, the heat dissipation material 103 does not follow the warpage or deformation and becomes the state of being not thermally connected to the semiconductor chip 102 partly (see places represented by symbols X in FIG. 22) and it becomes difficult to ensure sufficient heat dissipation performance. This applies also to the case in which warpage or deformation occurs in the heat spreader 104.

In the present embodiment, as illustrated in FIG. 1, the length of the first carbon nanotubes 7A forming the first sheet 7 is longer than the length of the second carbon nanotubes 8A forming the second sheet 8.

Here, the length of the first carbon nanotubes 7A forming the first sheet 7 is 100 to 500 μm and the length of the second carbon nanotubes 8A forming the second sheet 8 is 20 to 200 μm.

The length of the first carbon nanotubes 7A is equivalent to the thickness of the first sheet 7, for example, the thickness of the first sheet 7 in the orientation direction of the first carbon nanotubes 7A. The length of the second carbon nanotubes 8A is equivalent to the thickness of the second sheet 8, for example, the thickness of the second sheet 8 in the orientation direction of the second carbon nanotubes 8A.

Here, it is preferable to set the length of the first carbon nanotubes 7A to such a length that the desired thickness of the sheet may be ensured.

Furthermore, it suffices for the length of the second carbon nanotubes 8A to be such a length that, when warpage or deformation occurs in the semiconductor chip 1 or the heat spreader 3 (in FIG. 2, when warpage or deformation occurs in the semiconductor chip 1), the second carbon nanotubes 8A may follow the warpage or deformation. For example, the length of the second carbon nanotubes 8A may be decided according to the magnitude of the warpage or deformation that occurs in the semiconductor chip 1 or the heat spreader 3.

Incidentally, in the electronic apparatus of the present embodiment, the heat dissipation sheet 2 is set in such a manner that the second sheet 8 exists on the side of the semiconductor chip 1 as illustrated in FIG. 2. For example, the amount of deformation when pressure is applied is larger in the second carbon nanotubes 8A than in the first carbon nanotubes 7A and the second sheet 8 is set to exist on the side of the semiconductor chip 1. Due to this, when warpage or deformation occurs in the semiconductor chip 1, the heat dissipation sheet 2 may follow the warpage or deformation.

Figure 3:
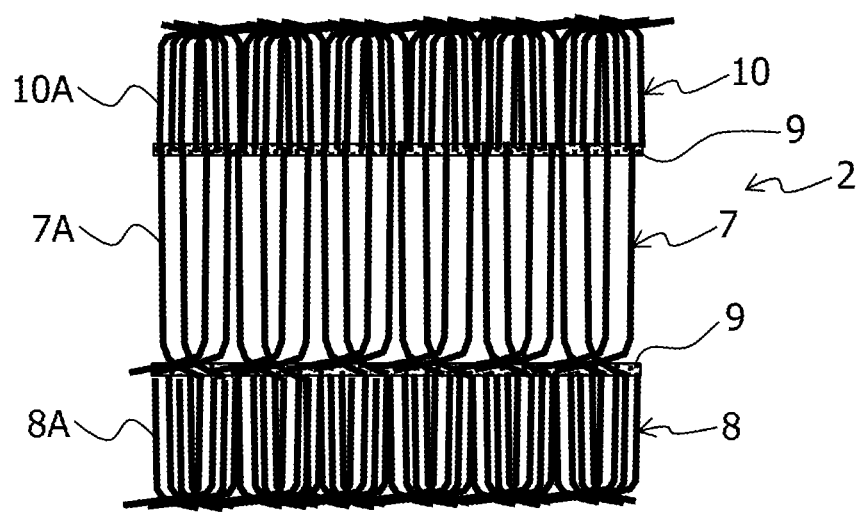
FIG. 3 is a schematic diagram illustrating a configuration of a modification example of a heat dissipation sheet according to the embodiment.

Furthermore, for example, the heat dissipation sheet 2 may have the following configuration. For example, as illustrated in FIG. 3, the heat dissipation sheet 2 includes a third sheet 10 composed of plural third carbon nanotubes 10A and the third sheet 10 is coupled in the state of being stacked on the opposite side to the second sheet 8 across the first sheet 7. In addition, the amount of deformation when pressure is applied is larger in the third carbon nanotubes 10A than in the first carbon nanotubes 7A and the third sheet 10 is set to exist on the side of the heat spreader 3 (see FIG. 2). Due to this, when warpage or deformation occurs in the heat spreader 3, the heat dissipation sheet 2 may follow the warpage or deformation.

In the case of employing the configuration in which the heat dissipation sheet 2 includes the third sheet 10, the third carbon nanotubes 10A forming the third sheet 10 may be subjected to densification treatment to cause the number of third carbon nanotubes 10A per unit time to become large compared with the first carbon nanotubes 7A forming the first sheet 7 as described later similarly to the second carbon nanotubes 8A forming the above-described second sheet 8.

Figure 4:
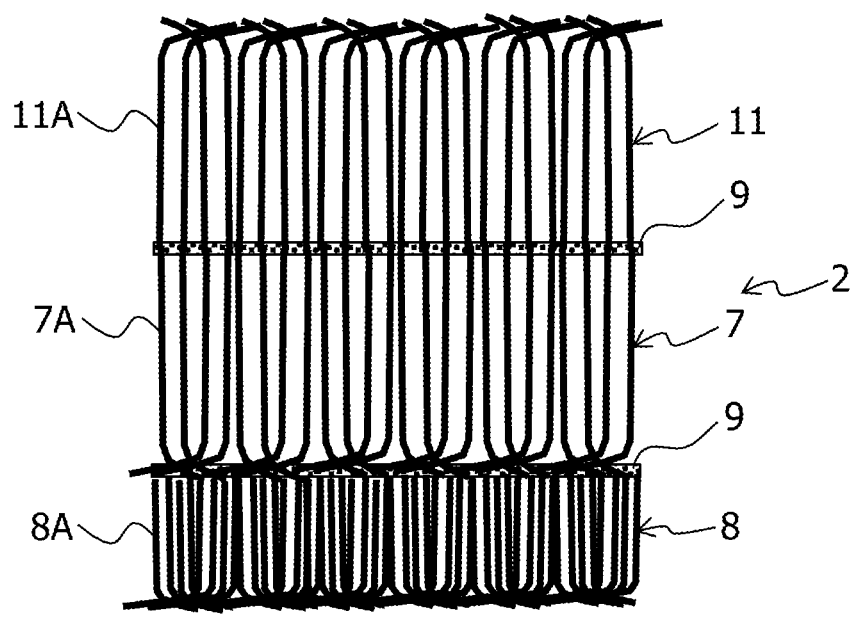
FIG. 4 is a schematic diagram illustrating a configuration of a modification example of a heat dissipation sheet according to the embodiment.

Moreover, for example, the heat dissipation sheet 2 may have the following configuration. For example, as illustrated in FIG. 4, the heat dissipation sheet 2 includes a fourth sheet 11 composed of plural fourth carbon nanotubes 11A and the fourth sheet 11 is coupled in the state of being stacked on the opposite side to the second sheet 8 across the first sheet 7. In addition, the fourth carbon nanotubes 11A are the same as the first carbon nanotubes 7A in the amount of deformation when pressure is applied.

This may ensure the thickness of the sheet according to need. For example, if the length of the carbon nanotubes that may grow is approximately 500 μm, carbon nanotubes with a length of approximately 1000 μm may be obtained by coupling the fourth carbon nanotubes 11A with a length of approximately 500 μm to the first carbon nanotubes 7A with a length of approximately 500 μm.

Incidentally, the above-described first carbon nanotubes 7A, in which the amount of deformation when pressure is applied is small, may be fabricated by carrying out high-temperature treatment (thermal treatment; heating treatment) like one described later. Thus, the first carbon nanotubes 7A are referred to also as high-temperature treatment carbon nanotubes or thermal treatment carbon nanotubes.

On the other hand, in carbon nanotubes for which high-temperature treatment like that described later has not been carried out, the amount of deformation when pressure is applied is large. For example, the above-described second carbon nanotubes 8A, in which the amount of deformation when pressure is applied is large, are carbon nanotubes for which high-temperature treatment like that described later has not been carried out.

Furthermore, the G/D ratio is higher in the carbon nanotubes for which high-temperature treatment has been carried out than in the carbon nanotubes for which high-temperature treatment has not been carried out. Thus, the G/D ratio is higher in the first carbon nanotubes 7A than in the second carbon nanotubes 8A. The G/D ratio is the ratio of intensity of the G band and the D band in the Raman spectrum.

Figure 7:
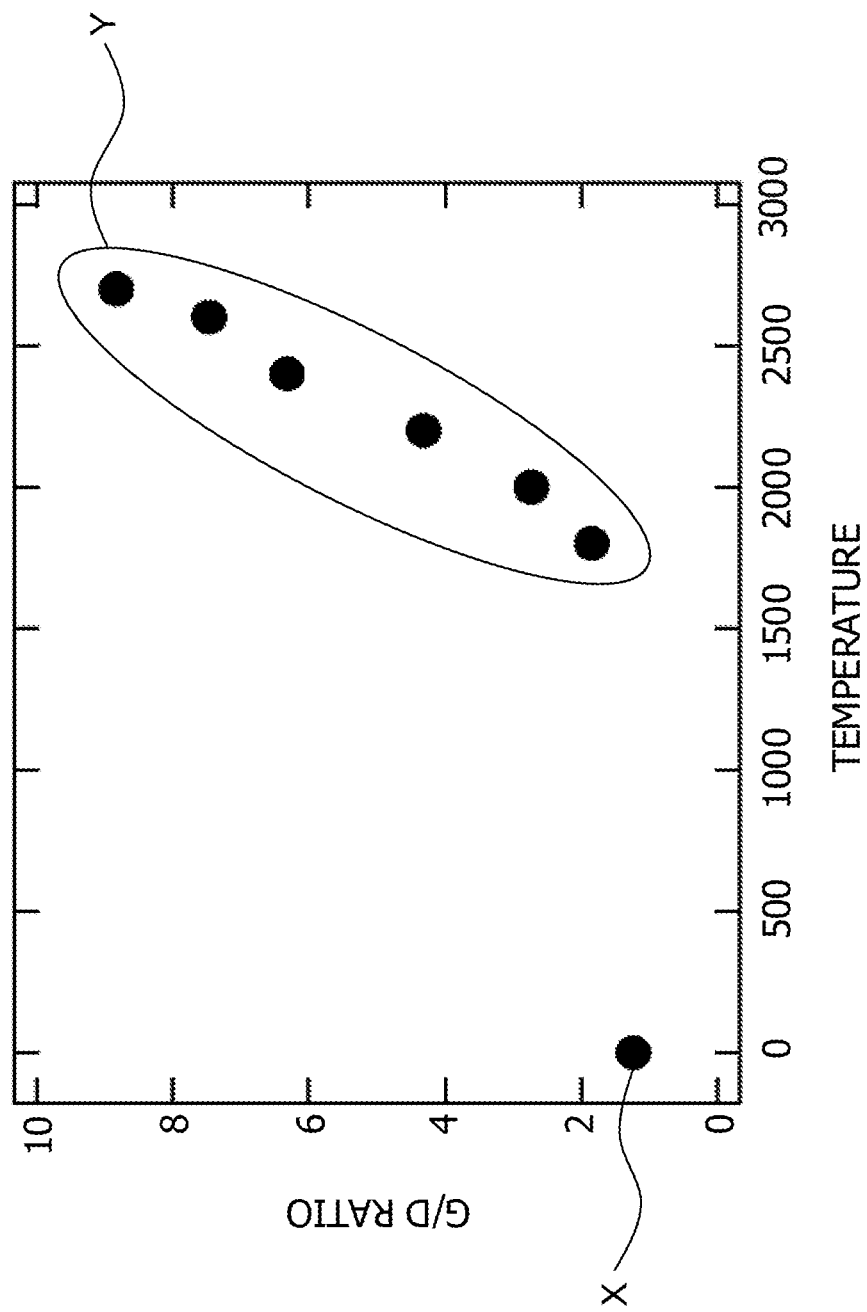
FIG. 7 is a diagram illustrating a G/D ratio of a high-temperature treatment carbon nanotube sheet according to the embodiment.

Here, the G/D ratio is equal to or higher than 2 in the first carbon nanotubes 7A and the G/D ratio is lower than 2 in the second carbon nanotubes 8A (for example, see FIG. 7).

In the carbon nanotubes that have been subjected to high-temperature treatment and have increased in the G/D ratio as above, the thermal conductivity becomes high and thermal characteristics become favorable compared with the carbon nanotubes that have not been subjected to high-temperature treatment and have a low G/D ratio. Thus, the thermal conductivity is higher in the first carbon nanotubes 7A than in the second carbon nanotubes 8A.

Furthermore, the carbon nanotubes for which high-temperature treatment has been carried out, for example, carbon nanotubes that have increased in the G/D ratio, become harder. Thus, the amount of deformation when pressure is applied becomes smaller than in the carbon nanotubes for which high-temperature treatment has not been carried out, for example, the carbon nanotubes in which the G/D ratio is low.

Thus, by employing, as the heat dissipation sheet 2, a sheet in which the first sheet 7 composed of the first carbon nanotubes 7A, for which high-temperature treatment has been carried out, and the second sheet 8 composed of the second carbon nanotubes 8A, for which high-temperature treatment has not been carried out, are coupled in a stacked state, the heat dissipation sheet 2 may be allowed to follow warpage or deformation of the semiconductor chip 1 or the heat spreader 3 while thermal characteristics are made favorable and the thickness of the sheet is ensured.

For example, with the heat dissipation sheet using only the carbon nanotubes for which high-temperature treatment has not been carried out, it is difficult to ensure the thickness of the sheet because the amount of deformation when pressure is applied is large. Furthermore, thermal characteristics are also insufficient. On the other hand, with the heat dissipation sheet using only the carbon nanotubes for which high-temperature treatment has been carried out, it is difficult to follow warpage or deformation of the semiconductor chip or the heat spreader because the amount of deformation when pressure is applied is small.

Thus, by employing, as the heat dissipation sheet 2, a sheet in which the first sheet 7 composed of the first carbon nanotubes 7A, for which high-temperature treatment has been carried out, and the second sheet 8 composed of the second carbon nanotubes 8A, for which high-temperature treatment has not been carried out, are coupled in a stacked state, the heat dissipation sheet 2 is allowed to follow warpage or deformation of the semiconductor chip 1 or the heat spreader 3 while thermal characteristics are made favorable and the thickness of the sheet is ensured.

Incidentally, in the present embodiment, in order to make the thermal conductivity higher and make thermal characteristics more favorable, the second sheet 8 composed of the carbon nanotubes for which high-temperature treatment has not been carried out, for example, the above-described second carbon nanotubes 8A, in which the amount of deformation when pressure is applied is large, is densified to increase the density of the second carbon nanotubes 8A (for example, see FIG. 1 to FIG. 4) as described later. This may increase the thermal conduction paths, which may make the thermal conductivity higher and make thermal characteristics more favorable. For this reason, the second carbon nanotubes 8A are referred to also as densified carbon nanotubes or density-increased carbon nanotubes.

As above, when the sheet is densified, the number of carbon nanotubes per unit time becomes larger than when the sheet is not densified.

In the present embodiment, the second sheet 8 composed of the second carbon nanotubes 8A is densified, whereas the first sheet 7 composed of the first carbon nanotubes 7A is not densified (for example, see FIG. 1 to FIG. 4).

Thus, the second carbon nanotubes 8A forming the second sheet 8 are larger than the first carbon nanotubes 7A forming the first sheet 7 in the number of carbon nanotubes per unit time.

Here, when the sheet is not densified, the area occupancy rate of the carbon nanotubes forming the sheet in the sheet surface is approximately 1% to 5%. On the other hand, when the sheet is densified, the area occupancy rate of the carbon nanotubes forming the sheet in the sheet surface is approximately 4% to 15%. The sheet surface is the surface that gets contact with the semiconductor chip 1 or the heat spreader 3 and therefore is referred to also as the contact surface or contact region.

Figure 5:
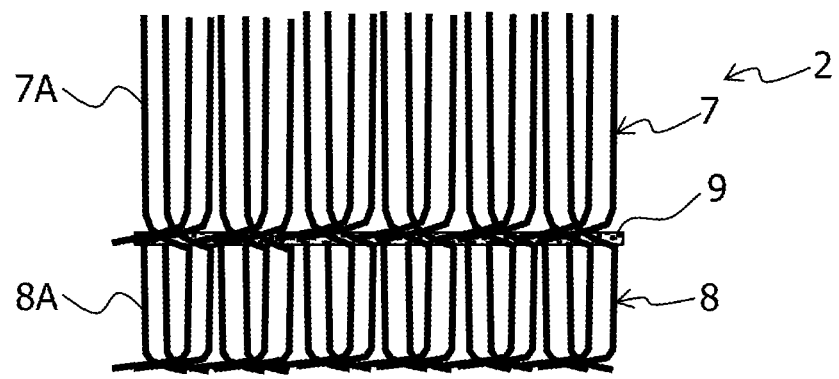
FIG. 5 is a schematic diagram illustrating a configuration of a modification example of a heat dissipation sheet according to the embodiment.

Although the second sheet 8 is densified here, the configuration is not limited thereto and the second sheet 8 does not have to be densified similarly to the first sheet 7 (for example, see FIG. 5).

Therefore, the area occupancy rate of the first carbon nanotubes 7A forming the first sheet 7 in the sheet surface is approximately 1% to 5%. On the other hand, the area occupancy rate of the second carbon nanotubes 8A forming the second sheet 8 in the sheet surface is approximately 2% to 15%.

As described above, the present embodiment employs the heat dissipation sheet 2 with a two-layer structure including the first sheet 7 (heat dissipation layer) using the high-temperature treatment carbon nanotubes 7A superior in thermal characteristics and the sheet thickness and the second sheet 8 (tight contact layer; deformation following layer) using the densified carbon nanotubes 8A superior in thermal characteristics and the following performance. This implements a heat dissipation sheet that may follow deformation of a chip and so forth and has low thermal resistance.

Next, the manufacturing method of a heat dissipation sheet according to the present embodiment will be described.

The manufacturing method of a heat dissipation sheet according to the present embodiment includes a process of fabricating the first sheet 7 composed of the plural first carbon nanotubes 7A (for example, see FIG. 6 to FIG. 8), a process of fabricating the second sheet 8 composed of the plural second carbon nanotubes 8A larger than the first carbon nanotubes 7A in the amount of deformation when pressure is applied (for example, see FIG. 9 and FIG. 10), and a process of stacking and coupling the first sheet 7 and the second sheet 8 (for example, see FIG. 11 to FIG. 18).

In the present embodiment, the first sheet 7 and the second sheet 8 are coupled by the resin (resin layer) 9 in the process of stacking and coupling the first sheet 7 and the second sheet 8 (for example, see FIG. 11 to FIG. 18).

Furthermore, in the present embodiment, as described later, the process of stacking and coupling the first sheet 7 and the second sheet 8 (for example, see FIG. 11 to FIG. 18) includes a process of stacking the first sheet 7 and the second sheet 8 with the intermediary of the resin film 9X (for example, see FIG. 11 to FIG. 16) and a process of carrying out thermocompression bonding in such a manner that end parts of the first carbon nanotubes 7A get contact with end parts of the second carbon nanotubes 8A (for example, see FIG. 17).

Moreover, in the present embodiment, as described later, thermal treatment (high-temperature treatment; heating treatment) is carried out for the first carbon nanotubes 7A in the process of fabricating the first sheet 7 (for example, see FIG. 6 to FIG. 8). For example, in the process of fabricating the first sheet 7, the thermal treatment is carried out for the first carbon nanotubes 7A to cause the G/D ratio to become higher than the second carbon nanotubes 8A (for example, see FIG. 6 and FIG. 7).

In addition, in the present embodiment, as described later, the process of fabricating the second sheet 8 (for example, see FIG. 9 and FIG. 10) includes a process of fabricating the second sheet 8 with a size larger than the first sheet 7 and a process of densifying the second sheet 8 to cause the size of the second sheet 8 to become the same size as the first sheet 7.

Figure 9:
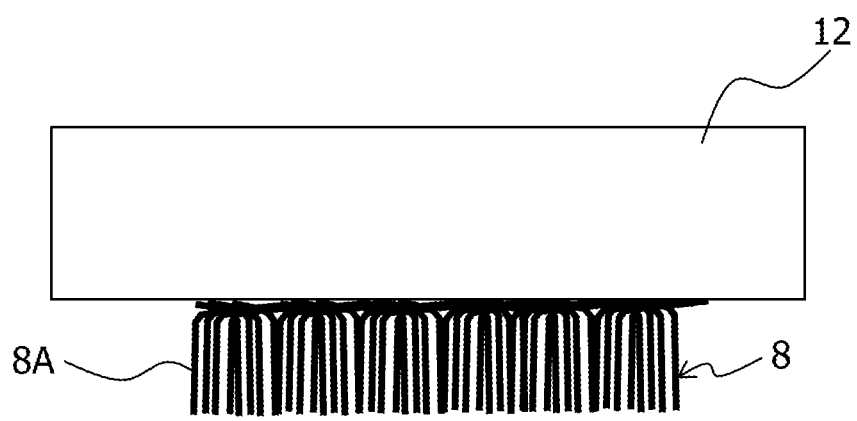
FIG. 9 is a schematic diagram illustrating a configuration of a densified carbon nanotube sheet according to the embodiment.
Figure 10:
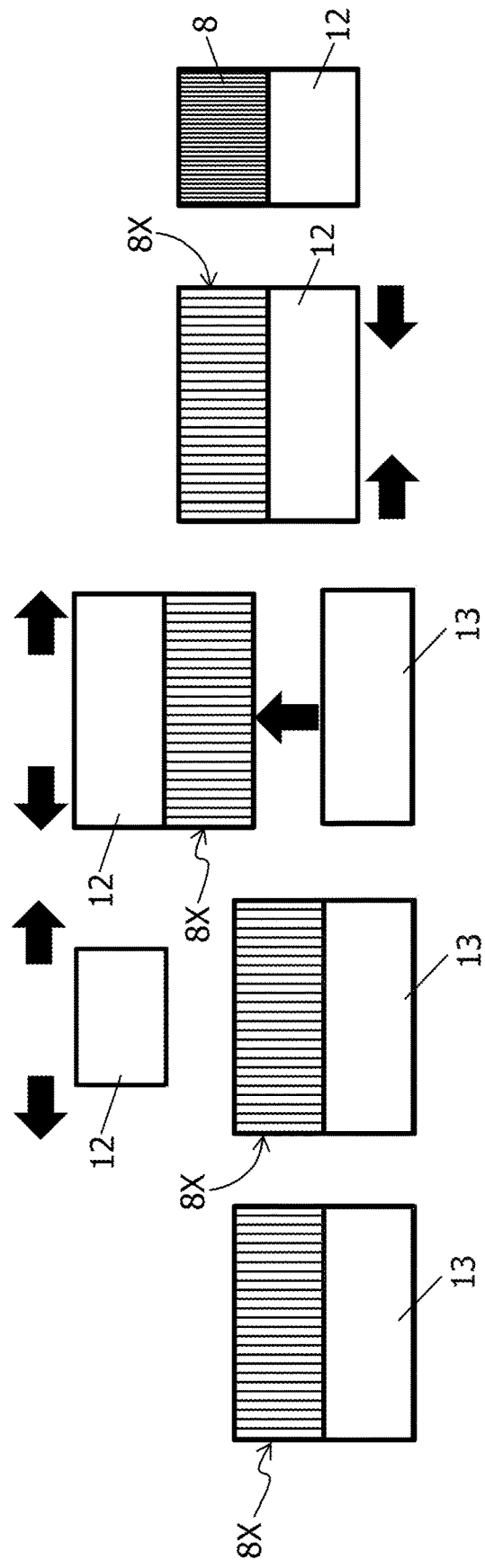
FIGS. 10A to 10E are schematic diagrams for explaining a fabrication method of a densified carbon nanotube sheet according to the embodiment.

Furthermore, in the present embodiment, the second sheet 8 is densified by using a silicone rubber sheet 12 in the process of densifying the second sheet 8 (for example, see FIG. 9 and FIG. 10). By using the silicone rubber sheet 12 as above, the residue may be kept from being left after the silicone rubber sheet 12 is removed.

Examples will be described below.

First, a fabrication method of a sheet using carbon nanotubes (carbon nanotube sheet) will be described.

The carbon nanotubes may be either single-layer carbon nanotubes or multilayer carbon nanotubes. Furthermore, the surface density of the carbon nanotubes is not particularly limit but it is desirable that the surface density be equal to or higher than approximately $1 \times 10^{10}/cm^2$ in terms of heat dissipation performance and electrical conductivity. Moreover, the length of the carbon nanotubes, for example, the thickness of the sheet, is determined depending on the use purpose of the sheet and is not particularly limited. However, preferably the length may be set to a value of approximately 50 to 2500 μm.

First, a substrate used as a base for forming carbon nanotubes is prepared.

As the substrate, semiconductor substrates such as a silicon substrate, insulating substrates such as alumina substrate, sapphire substrate, MgO substrate, and glass substrate, metal substrates such as a stainless steel substrate, stainless steel foil, aluminum foil, and so forth may be used. Furthermore, a base obtained by forming a thin film on any of these substrates may be used. For example, a base obtained by forming a silicon oxide film with a film thickness of approximately 300 nm on a silicon substrate may be used. This is referred to as a silicon (Si) substrate with an oxide film or a silicon (Si) substrate with a thermal oxide film.

The substrate is removed after formation of carbon nanotubes. For this reason, it is desirable that the substrate be not transformed at the formation temperature of the carbon nanotubes. Furthermore, it is desirable that at least the surface that gets contact with the carbon nanotubes be composed of a material that may be easily removed from the carbon nanotubes. Moreover, it is desirable that the substrate be composed of a material that may be etched selectively with respect to the carbon nanotubes.

Subsequently, on the substrate, a Fe (iron) film with a film thickness of approximately 2.5 nm, for example, a catalytic metal film composed of Fe, is formed by a sputtering method, for example. The disposing of the catalytic metal film may be decided according to the use purpose.

As the catalytic metal, besides Fe, Co (cobalt), Ni (nickel), Au (gold), Ag (silver), Pt (platinum), or an alloy containing at least one material among these metals may be used. Furthermore, as the catalyst, besides the metal film, metal particles fabricated with the size controlled in advance by using a differential mobility analyzer (DMA) or the like may be used. Also in this case, the kinds of metal may be similar to the thin film.

Furthermore, as an underlying film of these catalytic metals, a film composed of the following material may be formed: Mo (molybdenum), Ti (titanium), Hf (hafnium), Zr (zirconium), Nb (niobium), V (vanadium), TaN (tantalum nitride), $TiSi_x$ (titanium silicide), Al (aluminum), $Al_2O_3$ (aluminum oxide), $TiO_x$ (titanium oxide), Ta (tantalum), W (tungsten), Cu (copper), Au (gold), Pt (platinum), Pd (palladium), TiN (titanium nitride), or an alloy containing at least one material among these metals.

For example, a stacking structure of Fe (approximately 2.5 nm)/Al (approximately 10 nm), a stacking structure of Co (approximately 2.6 nm)/TiN (approximately 5 nm), or the like may be applied. In the case of using metal particles, a stacking structure of Co (average diameter is approximately 3.8 nm)/TiN (approximately 5 nm) may be applied, for example.

Subsequently, over the substrate, carbon nanotubes are grown by, for example, a hot filament chemical vapor deposition (CVD) method with use of the catalytic metal film as a catalyst.

The growth condition of the carbon nanotubes is as follows, for example. A mixed gas of acetylene and argon (partial pressure ratio is 1 to 9) is used as the source gas and the total gas pressure in the deposition chamber is approximately 1 kPa. The hot filament temperature is approximately 1000° C. and the growth time is approximately 20 minutes. This may grow multilayer carbon nanotubes with the following parameters: the number of layers is approximately 3 to 6 (approximately four layers on average); the diameter is approximately 4 to 8 nm (approximately 6 nm on average); and the length is approximately 80 μm (growth rate: approximately 4 μm/minute).

The carbon nanotubes may be formed by another deposition method such as a thermal CVD method or a remote plasma CVD method. Furthermore, the grown carbon nanotubes may be single-layer carbon nanotubes. In addition, as the carbon material, besides acetylene, hydrocarbons such as methane and ethylene, alcohols such as ethanol and methanol, and so forth may be used.

In this manner, plural carbon nanotubes oriented in the normal direction of the substrate (perpendicular orientation) are formed over the substrate, for example, on the region in which the catalytic metal film of the substrate has been formed.

In the carbon nanotubes formed under the above-described growth condition, the surface density was approximately $1 \times 10^{11}/cm^2$. Furthermore, because of the growth mechanism, the tip parts mingle with each other in the horizontal direction in many carbon nanotubes.

The diameter and the number of layers of the carbon nanotubes used for the heat dissipation sheet are not particularly limited but preferably may be set to a range of approximately 1 to 50 nm and a range of approximately 1 to 150, respectively.

Subsequently, the carbon nanotubes grown over the substrate are removed from the substrate and are extracted as a sheet.

In this manner, the sheet using the carbon nanotubes (carbon nanotube sheet, sheet-shaped carbon nanotubes) may be fabricated.

Next, a method for manufacturing the heat dissipation sheet of the present embodiment by using the sheet fabricated in the above-described manner will be described with reference to FIG. 6 to FIG. 18.

Figure 6:
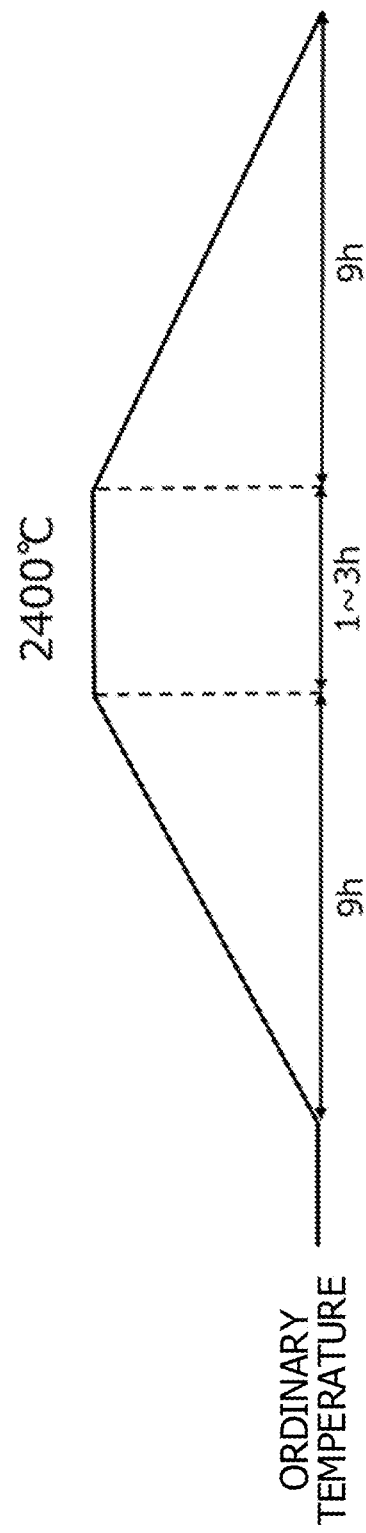
FIG. 6 is a diagram illustrating a temperature profile in a case of fabricating a high-temperature treatment carbon nanotube sheet according to the embodiment.
Figure 8:
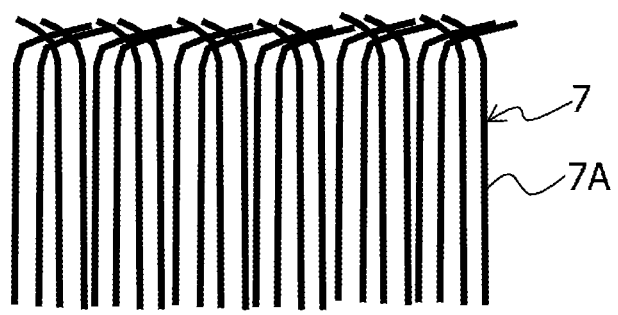
FIG. 8 is a schematic diagram illustrating a configuration of a high-temperature treatment carbon nanotube sheet according to the embodiment.

First, in order to fabricate the first sheet 7 composed of the first carbon nanotubes 7A, in which the amount of deformation when pressure is applied is small, thermal treatment (heating treatment) is carried out for the carbon nanotube sheet fabricated in the above-described manner (see FIG. 6 to FIG. 8).

Here, high-temperature treatment is carried out by a high-temperature carbon baking furnace.

For example, first, the carbon nanotube sheet fabricated in the above-described manner is set in a jig for heating in such a manner as to be sandwiched by carbon sheets, for example. The purpose of this is to keep concavities and convexities of the sheet surface from becoming large due to the movement of the carbon nanotubes because the carbon nanotubes move in such a direction as to contract at the time of high-temperature treatment.

Subsequently, the jig for heating in which the carbon nanotube sheet is disposed in the above-described manner is put in the high-temperature carbon baking furnace (ultra-high temperature graphite furnace) and the high-temperature treatment is carried out.

Here, the inside of the chamber is evacuated to a vacuum and the residual gas is discharged, and the high-temperature treatment is carried out in an Ar gas atmosphere.

Furthermore, as the high-temperature treatment, with a temperature profile like one illustrated in FIG. 6, for example, treatment of increasing the temperature to approximately 2400° C. at a temperature increase rate of approximately 2° C./minute (approximately nine hours) and keeping the temperature at approximately 2400° C. for a certain time (approximately one to three hours; for example, approximately two hours) and decreasing the temperature to the ordinary temperature at a temperature decrease rate of approximately 2° C./minute (approximately nine hours) is carried out.

When such high-temperature treatment is carried out, as represented in symbol Y in FIG. 7, the G/D ratio becomes high compared with the case in which the high-temperature treatment is not carried out (see symbol X in FIG. 7). For example, the G/D ratio is lower than 2 when the high-temperature treatment is not carried out, whereas the G/D ratio becomes 2 or higher when the high-temperature treatment is carried out. When the high-temperature treatment is carried out and the G/D ratio becomes higher as above, the thermal conductivity becomes higher and thermal characteristics become favorable compared with the case in which the high-temperature treatment is not carried out.

Then, the carbon nanotube sheet for which the high-temperature treatment has been carried out is taken out and planarization treatment of aligning the end surfaces of both the upper and lower surfaces is carried out by a press machine.

In this manner, by carrying out the high-temperature treatment for the carbon nanotube sheet fabricated in the above-described manner, the carbon nanotube sheet for which the high-temperature treatment has been carried, for example, the first sheet 7 composed of the first carbon nanotubes 7A, in which the amount of deformation when pressure is applied is small, may be fabricated (for example, see FIG. 8).

Incidentally, as the second sheet 8 composed of the second carbon nanotubes 8A, in which the amount of deformation when pressure is applied is large, the carbon nanotube sheet fabricated in the above-described manner, for example, the carbon nanotube sheet for which high-temperature treatment has not been carried out, may be used as it is. Alternatively, a densified carbon nanotube sheet fabricated by densifying the carbon nanotube sheet fabricated in the above-described manner may be used.

Description will be made below by taking as an example the case in which the densified carbon nanotube sheet fabricated by densifying the carbon nanotube sheet fabricated in the above-described manner is used as the second sheet 8 composed of the second carbon nanotubes 8A, in which the amount of deformation when pressure is applied is large.

In this case, when the carbon nanotube sheet is fabricated in the above-described manner, a carbon nanotube sheet with a size larger than the carbon nanotube sheet used as the first sheet 7 (for example, triple size) is fabricated and the carbon nanotube sheet thus fabricated is densified to fabricate the densified carbon nanotube sheet with the same size as the first sheet 7 (for example, threefold-densified carbon nanotube sheet) (for example, see FIG. 9).

Here, the silicone rubber (here, silicone rubber sheet) 12 is used and the carbon nanotube sheet with the large size fabricated in the above-described manner is densified to fabricate the densified carbon nanotube sheet. This sheet is used as the second sheet 8 composed of the second carbon nanotubes 8A, in which the amount of deformation when the pressure is applied is large.

For example, as illustrated in FIG. 10A, FIG. 10B, and FIG. 10C, a carbon nanotube sheet 8X that is fabricated in the above-described manner and has a large size is transferred to the silicone rubber sheet 12 expanded in a radial manner and a substrate 13 is removed.

Here, the rubber sheet used is not limited to the silicone rubber. For example, natural rubber, synthetic rubber, and so forth may also be applied and there is no particular limitation also regarding other materials as long as densification may be similarly carried out.

Subsequently, as illustrated in FIG. 10D and FIG. 10E, the expanding force is released from the silicone rubber sheet 12 expanded in a radial manner to return the silicone rubber sheet 12 to the original size. Due to this, the carbon nanotube sheet 8X with the large size fabricated in the above-described manner is densified, so that a densified carbon nanotube sheet with the same size as the first sheet 7 is fabricated.

Then, this densified carbon nanotube sheet is used as the second sheet 8 composed of the second carbon nanotubes 8A, in which the amount of deformation when pressure is applied is large (for example, see FIG. 9).

Next, the high-temperature treatment carbon nanotube sheet fabricated in the above-described manner (first sheet 7) and the densified carbon nanotube sheet fabricated in the above-described manner (second sheet 8) are stacked and coupled (for example, see FIG. 11 to FIG. 18).

Here, the first sheet 7 and the second sheet 8 are stacked with the intermediary of the resin film 9X (for example, see FIG. 11 to FIG. 16) and thermocompression bonding is carried out in such a manner that end parts of the first carbon nanotubes 7A of the first sheet 7 get contact with end parts of the second carbon nanotubes 8A of the second sheet 8 (for example, see FIG. 17). In this case, the first sheet 7 and the second sheet 8 are coupled by the resin 9.

Figure 11:
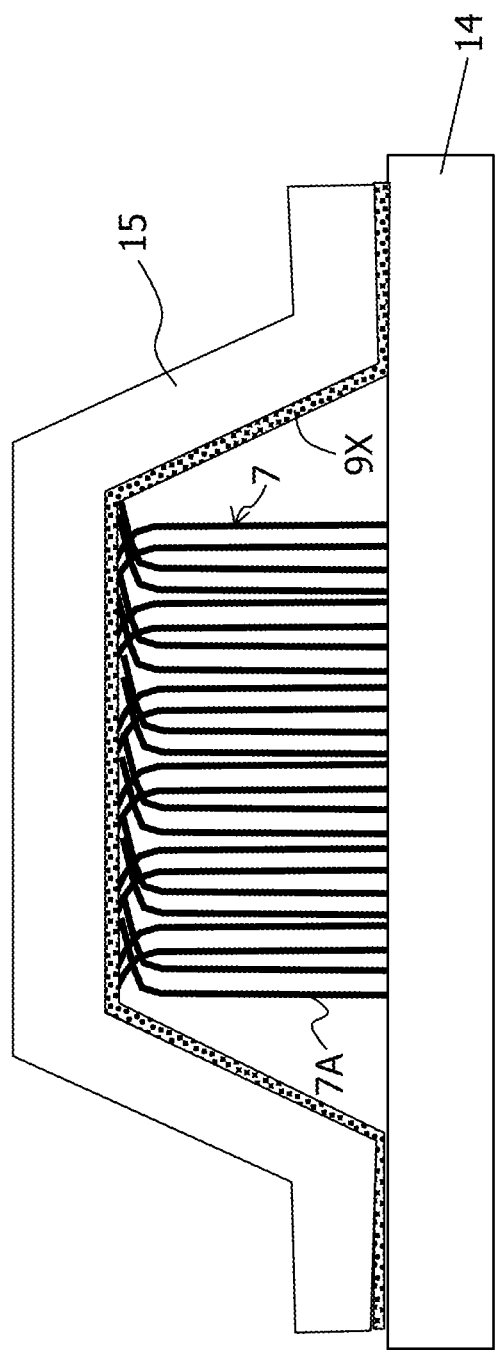
FIG. 11 is a schematic diagram for explaining a manufacturing method of a heat dissipation sheet according to the embodiment.

For example, first, as illustrated in FIG. 11, the high-temperature treatment carbon nanotube sheet (first sheet 7) fabricated in the above-described manner is set on a silicon substrate 14.

Next, the resin film 9X (here, thin-film resin film with a protective film) is set in such a manner that the high-temperature treatment carbon nanotube sheet 7 fabricated in the above-described manner is covered.

Next, by using a roller, for example, the thin-film resin film 9X with the protective film is thermocompressively bonded to the surface of the high-temperature treatment carbon nanotube sheet 7 fabricated in the above-described manner [end parts (end surfaces) of the first carbon nanotubes 7A] and the surface of the silicon substrate 14 around the high-temperature treatment carbon nanotube sheet 7.

Figure 12:
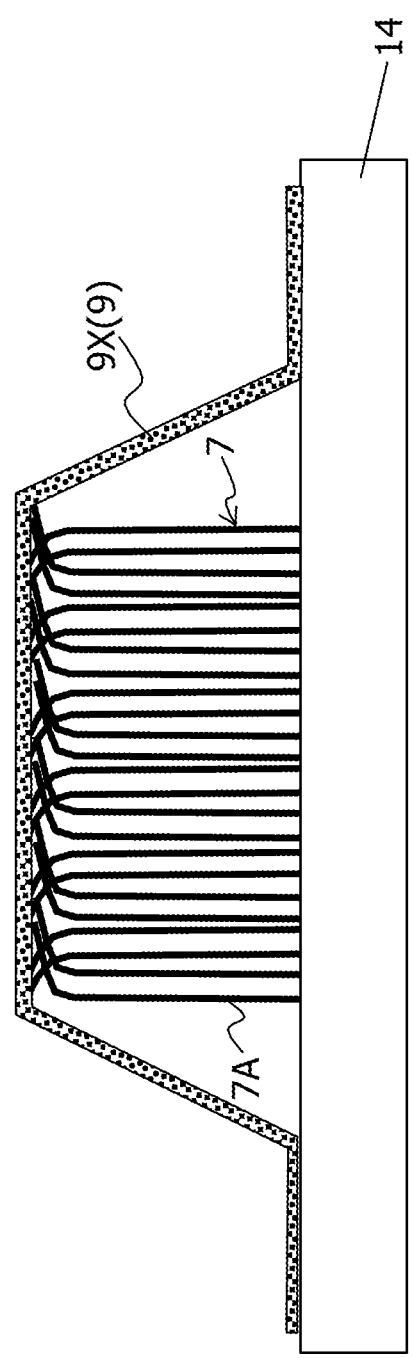
FIG. 12 is a schematic diagram for explaining a manufacturing method of a heat dissipation sheet according to the embodiment.

Next, as illustrated in FIG. 12, a protective film (protective sheet) 15 is removed.

In this case, the thin-film resin film 9X includes a part located on the surface of the high-temperature treatment carbon nanotube sheet 7 fabricated in the above-described manner, a part located on the surface of the silicon substrate 14, and a part that bridges the gap between these parts (bridge part).

Next, as illustrated in FIG. 13, the bridge part of the thin-film resin film 9X is reinforced by using a thermoplastic resin film 16 as a large-thickness film. The purpose of this is to allow the silicone rubber sheet 12 to be easily removed at the time of transfer of the densified carbon nanotube sheet 8 to be described later.

Next, as illustrated in FIG. 14, the densified carbon nanotube sheet (second sheet 8) that has been transferred to the silicone rubber sheet 12 and has been fabricated in the above-described manner is stacked on the thin-film resin film 9X in such a manner as to be located above the high-temperature treatment carbon nanotube sheet 7 (first sheet 7) set on the silicon substrate 14, and thermocompression bonding is carried out by using a roller, for example. Thus, end parts (end surfaces) of the first carbon nanotubes 7A of the first sheet 7 and end parts (end surfaces) of the second carbon nanotubes 8A of the second sheet 8 are joined with the intermediary of the thin-film resin film 9X (resin 9).

Next, as illustrated in FIG. 15, the silicone rubber sheet 12 used to fabricate the densified carbon nanotube sheet 8 is removed.

Next, as illustrated in FIG. 16, the thin-film resin film 9X is cut at the bridge part by a razor 17 or the like, for example, and a stacking sheet 2X in which the high-temperature treatment carbon nanotube sheet 7 and the densified carbon nanotube sheet 8 are stacked with the intermediary of the thin-film resin film 9X (resin 9) and are joined.

Next, as illustrated in FIG. 17, the extracted stacking sheet 2X is subjected to thermocompression bonding by a heating press machine, for example, to turn the stacking sheet 2X to a thin film so that the resin 9 that joins the high-temperature treatment carbon nanotube sheet 7 and the densified carbon nanotube sheet 8 may be kept from contributing to the resistance as much as possible. For example, the extracted stacking sheet 2X is subjected to the thermocompression bonding so that end parts of the first carbon nanotubes 7A of the first sheet 7 may get contact with end parts of the second carbon nanotubes 8A of the second sheet 8. This may reduce characteristic loss.

Next, as illustrated in FIG. 18, by using a press machine, for example, planarization treatment of applying pressure and aligning the end surfaces of both the upper and lower surfaces (sheet interfaces) is carried out. Here, a heating press machine is used, for example, and the planarization treatment is carried out with application of pressure several times higher than the above-described thermocompression bonding without heating.

In this manner, the high-temperature treatment carbon nanotube sheet (first sheet 7) and the densified carbon nanotube sheet (second sheet 8) are stacked and are coupled by the resin 9 and thereby the heat dissipation sheet 2 may be manufactured.

In the heat dissipation sheet 2 manufactured in this manner, the thickness of the sheet is also kept by the carbon nanotubes cured by the high-temperature treatment. In addition, by setting the densified carbon nanotubes on the side of the semiconductor chip 1 that is a heat generator, following the deformation or the like of the semiconductor chip 1 is also enabled. Furthermore, a structure excellent in handling and durability against breaking is obtained.

Therefore, the heat dissipation sheet, the manufacturing method of the heat dissipation sheet, and the electronic apparatus according to the present embodiment have an effect that it is possible to follow warpage or deformation of the semiconductor chip 1 or the heat spreader 3 while ensuring the thickness of the sheet.

For example, if the heat dissipation sheet 2 manufactured in the above-described manner is set between the semiconductor chip 1 that is a heat generator and the heat spreader 3 and is screwed to make a package, sufficient heat dissipation performance is obtained at a low pressure applied to the heat dissipation sheet 2 in this screwed package.

Figure 19B:
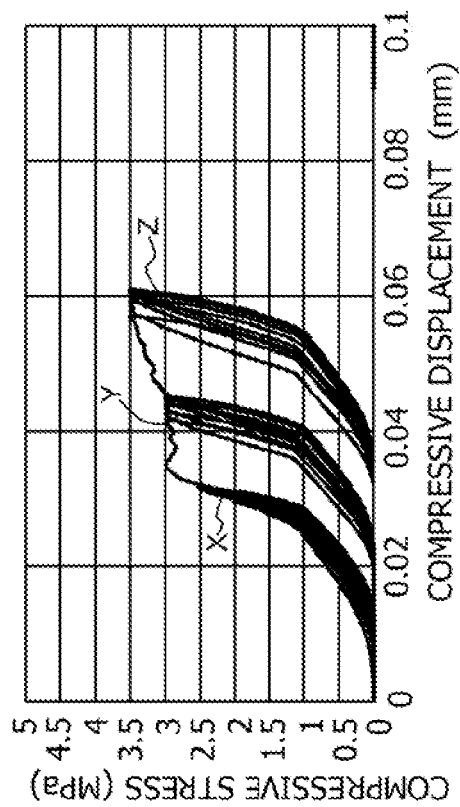
FIGS. 19A and 19B are diagrams for explaining an effect of a heat dissipation sheet according to the embodiment.
Figure 19A:
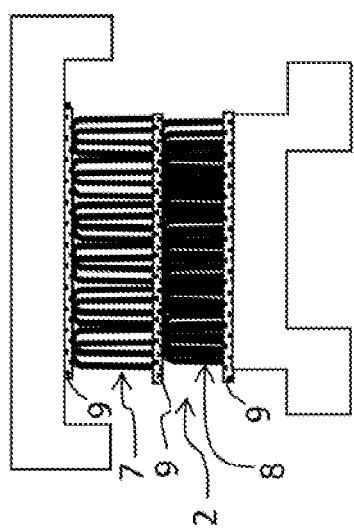

Here, FIG. 19B illustrates the relationship between compressive stress and compressive displacement when the compressive stress is applied to the heat dissipation sheet 2 of the present embodiment manufactured in the above-described manner (sheet in which the high-temperature treatment carbon nanotube sheet 7 and the threefold-densified carbon nanotube sheet 8 for which high-temperature treatment has not been carried out are stacked and are coupled by the resin 9) as illustrated in FIG. 19A.

Figure 20A:
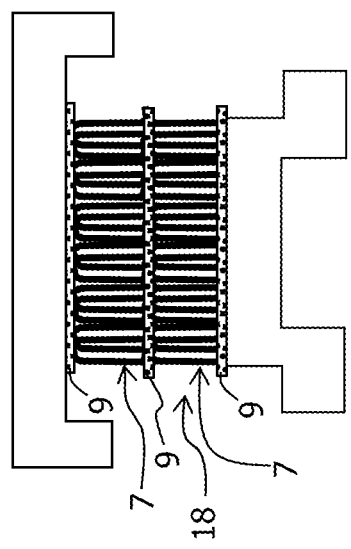
FIG. 20A is a schematic diagram illustrating a configuration when a heat dissipation sheet of a comparative example is used and FIG. 20B is a diagram illustrating relationship between compressive stress and compressive displacement when a heat dissipation sheet of the comparative example is used.
Figure 20B:
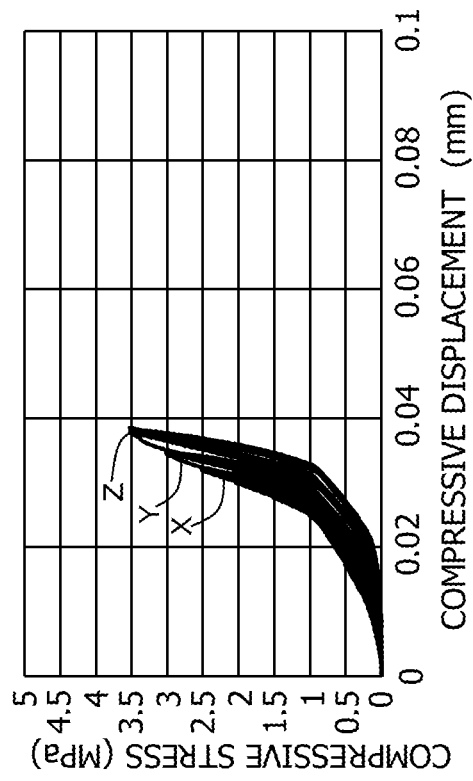

FIG. 20B illustrates the relationship between compressive stress and compressive displacement when the compressive stress is applied to a heat dissipation sheet 18 of a comparative example (sheet in which the high-temperature treatment carbon nanotube sheet 7 and the high-temperature treatment carbon nanotube sheet 7 are stacked and are coupled by the resin 9) as illustrated in FIG. 20A.

With the heat dissipation sheet 18 of the comparative example, as illustrated in FIG. 20B, the amount of displacement (compressive displacement) in the compression direction (thickness direction of the heat dissipation sheet 18) hardly changes and the amount of displacement is small even when the pressure applied to the heat dissipation sheet 18 (surface pressure; compressive stress) is increased to approximately 2 MPa (see symbol X in FIG. 20B), to approximately 3 MPa (see symbol Y in FIG. 20B), and to approximately 3.5 MPa (see symbol Z in FIG. 20B).

In contrast, with the heat dissipation sheet 2 of the present embodiment, as illustrated in FIG. 19B, the amount of displacement (compressive displacement) in the compression direction becomes higher when the pressure applied to the heat dissipation sheet 2 is increased to approximately 2 MPa (see symbol X in FIG. 19B), to approximately 3 MPa (see symbol Y in FIG. 19B), and to approximately 3.5 MPa (see symbol Z in FIG. 19B). Thus, it turns out that the threefold-densified carbon nanotube sheet 8 for which high-temperature treatment has not been carried out absorbs the pressure.

As above, at low pressure (for example, low pressure applied to the heat dissipation sheet in the screwed package), the threefold-densified carbon nanotube sheet 8 for which high-temperature treatment has not been carried out absorbs the pressure and is displaced (deformed). This makes it possible to follow the warpage or deformation of the semiconductor chip 1 or the heat spreader 3.

Furthermore, for example, the heat dissipation sheet 2 of the present embodiment allows the heat dissipation sheet using carbon nanotubes to be used as a reworkable heat dissipation sheet.

For example, the reworkable heat dissipation sheet is desired to satisfy all conditions of ensuring of the sheet thickness, following deformation of a chip or the like after packaging, heat dissipation performance at low pressure (because packaging is commonly carried out by screwing), reworkability, and sheet strength durability, and a heat dissipation sheet that may satisfy these demands may be implemented by the heat dissipation sheet 2 of the present embodiment. With heat dissipation sheets that are used thus far and contain a polymer or high thermal conductive material, it is difficult to implement the heat dissipation sheet that satisfies these demands.

In the above-described embodiment, description is made by taking as an example the case in which the heat dissipation sheet 2 is set at the joint part between the semiconductor chip 1 such as a large-scale integration (LSI) chip and the heat spreader 3. However, the configuration is not limited thereto and the heat dissipation sheet 2 may be applied to heat dissipation paths from various heat generators, for example. For example, in terms of high performance computing (HPC), the heat dissipation sheet 2 may be applied to the above-described place and besides, to the joint part between a package in which a CPU is incorporated and a heat sink [referred to as thermal interface material 2 (TIM2)] and so forth. Furthermore, it is also possible to apply the heat dissipation sheet 2 to high breakdown voltage modules and so forth of electric vehicles and airplanes, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A heat dissipation sheet comprising:
   a first sheet composed of a plurality of first carbon nanotubes, the first sheet being configured as a heat dissipation layer; and
   a second sheet composed of a plurality of second carbon nanotubes, the second sheet being configured as a tight contact layer, deformation of the tight contact layer being for following deformation of a heat generation source,
   the first sheet and the second sheet are coupled in a stacked state,
   the first carbon nanotubes and the second carbon nanotubes are different in an amount of deformation when first pressure to the first carbon nanotubes is applied and second pressure to the second nanotubes is applied, the first pressure being equal to the second pressure,
   a first amount of deformation that is an amount of deformation when the first pressure to the first carbon nanotubes is applied is an amount of deformation of several percentages with respect to a length before pressure is applied, and
   a second amount of deformation that is an amount of deformation when the second pressure to the second carbon nanotubes is applied is an amount of deformation of several tens of percentages with respect to a length before pressure is applied.

2. The heat dissipation sheet according to claim 1, wherein the first sheet and the second sheet are coupled by a resin.

3. The heat dissipation sheet according to claim 1, wherein thermal conductivity of the first carbon nanotubes is higher than thermal conductivity of the second carbon nanotubes.

4. The heat dissipation sheet according to claim 1, wherein a G/D ratio of the first carbon nanotubes is higher than a G/D ratio of the second carbon nanotubes.

5. The heat dissipation sheet according to claim 1, wherein the G/D ratio of the first carbon nanotubes is equal to or higher than 2, and the G/D ratio of the second carbon nanotubes is lower than 2.

6. The heat dissipation sheet according to claim 1, wherein the second carbon nanotubes forming the second sheet are larger than the first carbon nanotubes forming the first sheet in the number of carbon nanotubes per unit area.

7. The heat dissipation sheet according to claim 1, wherein
   an area occupancy rate of the first carbon nanotubes forming the first sheet in a sheet surface is 1% to 5%, and
   an area occupancy rate of the second carbon nanotubes forming the second sheet in a sheet surface is 2% to 15%.

8. The heat dissipation sheet according to claim 1, wherein length of the first carbon nanotubes forming the first sheet is longer than length of the second carbon nanotubes forming the second sheet.

9. The heat dissipation sheet according to claim 1, wherein
   the length of the first carbon nanotubes forming the first sheet is 100 to 500 μm, and
   the length of the second carbon nanotubes forming the second sheet is 20 to 200 μm.

10. The heat dissipation sheet according to claim 1, further comprising:
    a third sheet composed of a plurality of third carbon nanotubes, wherein
    the third sheet is coupled in a state of being stacked on an opposite side to the second sheet across the first sheet, and
    the second carbon nanotubes and the third carbon nanotubes are larger than the first carbon nanotubes in the amount of deformation when pressure is applied.

11. The heat dissipation sheet according to claim 1, further comprising:
    a third sheet composed of a plurality of fourth carbon nanotubes, wherein
    the third sheet is coupled in a state of being stacked on an opposite side to the second sheet across the first sheet, and
    the fourth carbon nanotubes are identical to the first carbon nanotubes in the amount of deformation when pressure is applied.

12. The heat dissipation sheet according to claim 1, wherein
    the first sheet is generated by performing a high-temperature treatment, and
    the second sheet is generated by densifying the a plurality of second carbon nanotubes that is not performed the high-temperature treatment.

13. An electronic apparatus comprising:
    a semiconductor chip;
    a heat dissipation sheet thermally connected to the semiconductor chip; and
    a heat spreader thermally connected to the heat dissipation sheet,
    the heat dissipation sheet includes
    a first sheet composed of a plurality of first carbon nanotubes, the first sheet being configured as a heat dissipation layer, and a second sheet composed of a plurality of second carbon nanotubes, the second sheet being configured as a tight contact layer, deformation of the tight contact layer being for following deformation of the semiconductor chip, the first sheet and the second sheet are coupled in a stacked state, and the first carbon nanotubes and the second carbon nanotubes are different in an amount of deformation when first pressure to the first carbon nanotubes is applied, the first pressure being equal to the second pressure, a first amount of deformation that is an amount of deformation when the first pressure to the first carbon nanotubes is applied is an amount of deformation of several percentages with respect to a length before pressure is applied, and a second amount of deformation that is an amount of deformation when the second pressure to the second carbon nanotubes is applied is an amount of deformation of several tens of percentages with respect to a length before pressure is applied.

14. The electronic apparatus according to claim 13, wherein the second carbon nanotubes are larger than the first carbon nanotubes in the amount of deformation when pressure is applied, and the second sheet is set to exist on a side of the semiconductor chip.

15. The electronic apparatus according to claim 14, wherein the heat dissipation sheet includes a third sheet composed of a plurality of third carbon nanotubes, the third sheet is coupled in a state of being stacked on an opposite side to the second sheet across the first sheet, the third carbon nanotubes are larger than the first carbon nanotubes in the amount of deformation when pressure is applied, and the third sheet is set to exist on a side of the heat spreader.

\* \* \* \* \*